(12) United States Patent
Meier et al.

(10) Patent No.: US 10,967,370 B2
(45) Date of Patent: Apr. 6, 2021

(54) MICROFLUIDIC DEVICE AND METHOD FOR MANUFACTURING THE SAME

(71) Applicant: Roche Molecular Systems, Inc., Pleasanton, CA (US)

(72) Inventors: Alexander Meier, Zurich (CH); Chris Steinert, Lucerne (CH); Michael Zeder, Buchrain (CH)

(73) Assignee: Roche Molecular Systems, Inc., Pleasanton, CA (US)

( * ) Notice: Subject to any disclaimer, the term of this patent is extended or adjusted under 35 U.S.C. 154(b) by 492 days.

(21) Appl. No.: 15/719,394

(22) Filed: Sep. 28, 2017

(65) Prior Publication Data

US 2018/0093268 A1    Apr. 5, 2018

(30) Foreign Application Priority Data

Sep. 30, 2016  (EP) .................................... 16400044

(51) Int. Cl.
*B01L 3/00*  (2006.01)
*C23C 14/02*  (2006.01)
*C23C 14/10*  (2006.01)

(52) U.S. Cl.
CPC ... *B01L 3/502707* (2013.01); *B01L 3/502746* (2013.01); *B01L 3/502761* (2013.01);
(Continued)

(58) Field of Classification Search
CPC ......... B01L 3/502707; B01L 3/502746; B01L 3/502761; B01L 2400/088;
(Continued)

(56) References Cited

U.S. PATENT DOCUMENTS 6,776,965 B2    8/2004    Wyzgol et al.
8,231,845 B2    7/2012    Wyzgol et al.
(Continued)

FOREIGN PATENT DOCUMENTS

WO      2015022781 A1    2/2015
WO      WO2016118915     7/2016

OTHER PUBLICATIONS

EP16400044.0 Search Report.
(Continued)

*Primary Examiner* — Samuel P Siefke
(74) *Attorney, Agent, or Firm* — Maneesh Gupta; Pamela C. Ancona

(57) ABSTRACT

The present disclosure provides a microfluidic device (1) comprising at least one flow channel (21) connecting an inlet opening (22) with an outlet opening (23), and an array of wells (24) in fluid communication with the flow channel (21), wherein the flow channel (21) comprises an inlet portion (211) at the inlet opening (22), an outlet portion (212) at the outlet opening (23), and a middle portion (213) between the inlet portion (211) and the outlet portion (212), wherein at least the middle portion (213) comprises the array of wells (24) and is provided with a hydrophilic surface, and the flow channel (21) further comprises a transition area (214) provided at least between the middle portion (213) and the outlet portion (212), which transition area (214) is constituted by providing a hydrophobic surface. Furthermore, a method for manufacturing such a microfluidic device is also provided.

19 Claims, 6 Drawing Sheets

(52) U.S. Cl.
CPC ............ *C23C 14/024* (2013.01); *C23C 14/10* (2013.01); *B01L 2200/12* (2013.01); *B01L 2300/0819* (2013.01); *B01L 2300/0822* (2013.01); *B01L 2300/0829* (2013.01); *B01L 2300/0864* (2013.01); *B01L 2300/0887* (2013.01); *B01L 2300/161* (2013.01); *B01L 2400/0406* (2013.01); *B01L 2400/086* (2013.01); *B01L 2400/088* (2013.01)

(58) Field of Classification Search
CPC ....... B01L 2300/0864; B01L 2400/086; B01L 2300/0822; B01L 2300/0819; B01L 2200/12; B01L 2300/0829; B01L 2300/0887; B01L 2300/161; B01L 2400/0406; B01L 3/5027; B01L 2300/12; B01L 2300/16; B01L 2300/165; B01L 2200/027; C23C 14/024; C23C 14/10
See application file for complete search history.

(56) References Cited

U.S. PATENT DOCUMENTS

| | | |
|---|---|---|
| 8,859,204 B2 | 10/2014 | Brown et al. |
| 2002/0114738 A1 | 8/2002 | Wyzgol |
| 2006/0051584 A1 | 3/2006 | Bieck et al. |
| 2016/0251701 A1 | 9/2016 | Chiou |
| 2016/0289669 A1* | 10/2016 | Fan .................. B01L 3/502746 |

OTHER PUBLICATIONS

K. Hattori et al: "Masked Plasma Oxidation Method as a Simple Micropatterning of Extracellular Matrix in a Closed Microchamber Array", Oct. 27, 2013 (Oct. 27, 2013), XP055354670.

\* cited by examiner

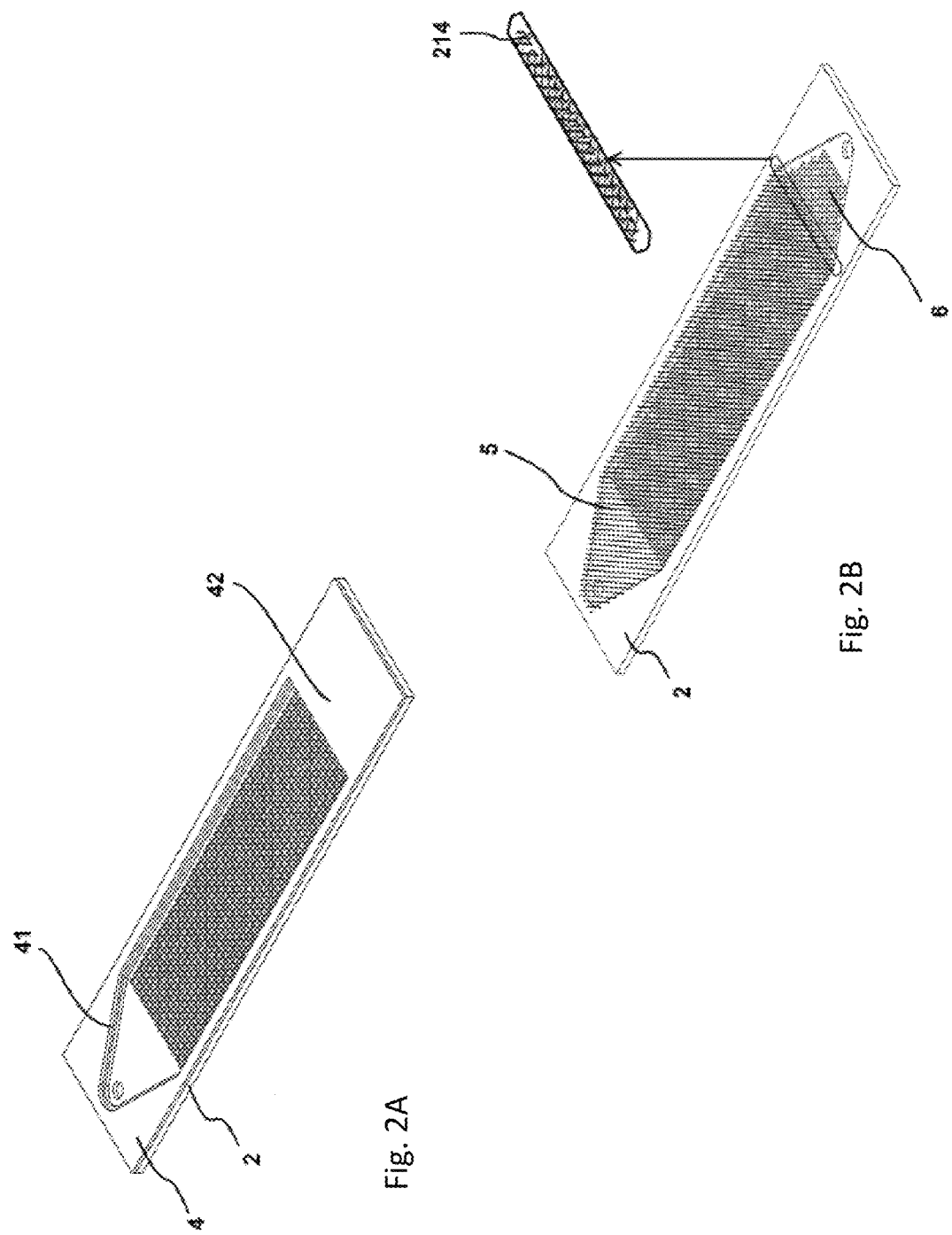

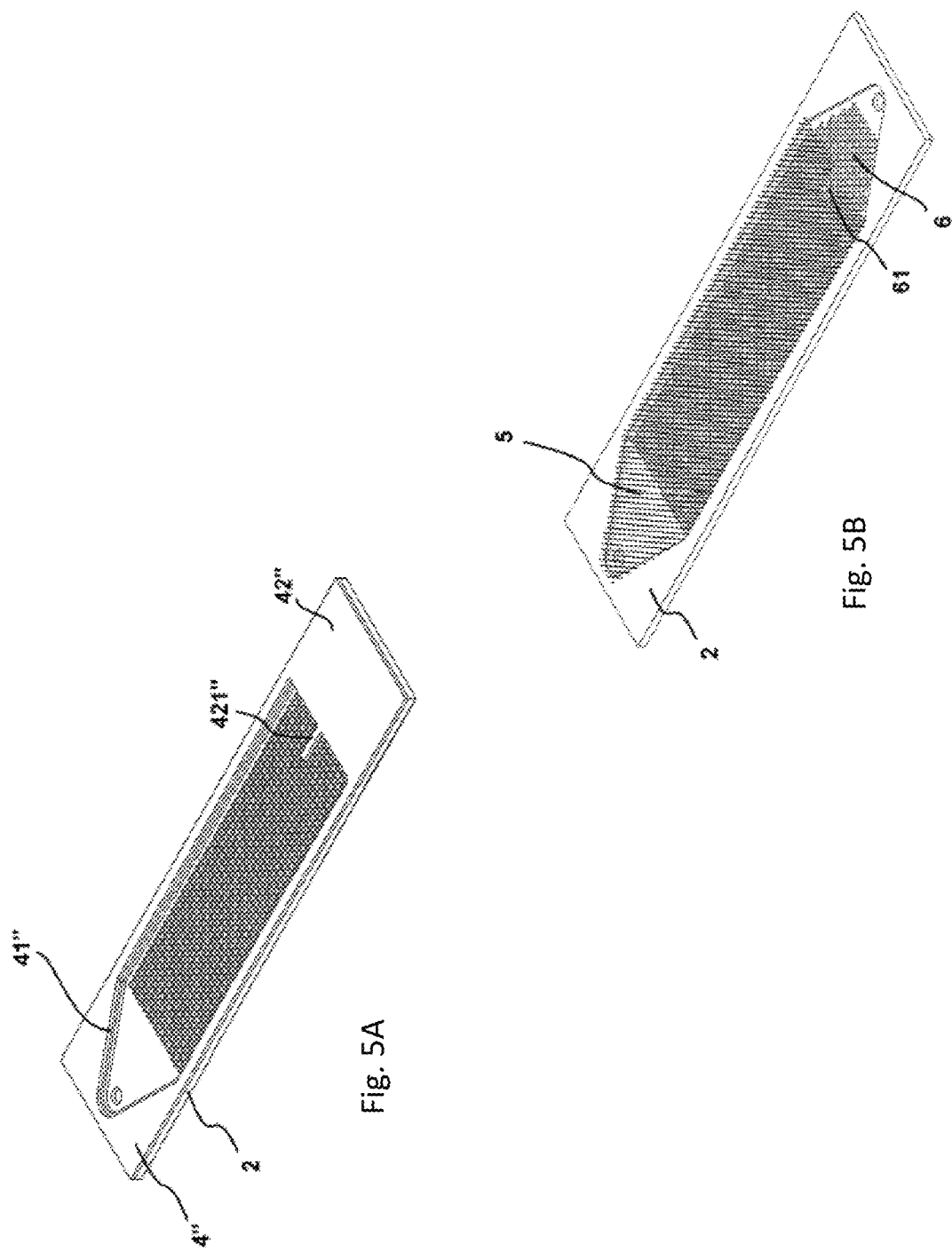

MICROFLUIDIC DEVICE AND METHOD FOR MANUFACTURING THE SAME

CROSS-REFERENCE TO RELATED APPLICATIONS

The present application claims the benefit of priority under 35 U.S.C. § 119(a) of 16400044.0, filed Sep. 30, 2016. Reference is also made to EP16183569.9, filed Aug. 10, 2016; EP16002058.2 and EP16002057.4, each filed Sep. 23, 2016; EP16191425.4, filed Sep. 29, 2016; and EP16191811.5, 16191771.1, each filed September 30. The disclosures of each of these applications are incorporated herein by reference in their entireties.

BACKGROUND

In the field of diagnostic technology for the assay of chemical or biochemical reactions, it is a goal to be able to carry out multiple different assays on one or more test samples on the same, preferably disposable, microfluidic device, thereby providing methods of independently analyzing one or more test samples with multiple different reagents in the course of a single analytic process. In more detail, the present disclosure relates to a microfluidic device comprising at least one flow channel in fluid communication with an array of wells which are intended, for example, as reaction chambers for chemical or biological reactions of at least one sample provided therein, respectively, and further to a method for manufacturing such a microfluidic device for the study of chemical or biological reactions occurring in the array of wells. In particular, the present disclosure is directed to an improved microfluidic device and an improved manufacturing method of the same, in order to achieve a filling of preferably all provided wells in the microfluidic device as comprehensive as necessary in order to avoid any unused or insufficiently filled wells on the microfluidic device.

In general, there is a need to make diagnostic assays faster, cheaper and simpler to perform while achieving precision as well as efficiency of conventional laboratory processes. In order to accomplish this goal, substantial effort has been made in order to achieve miniaturization and integration of various assay operations, for increasing the number of parallel assays on one single carrier device. However, when actually miniaturizing the reaction chamber volumes to become microfluidic structures of a microfluidic device in order to generate the desired dimensions, several already known problems increase, such as undesired liquid evaporation, as well as problems related to the increased surface-to-volume ratio. Also, and more importantly, shortcomings in sample liquid metering during a filling procedure of the microfluidic structures occur, which shortcomings are substantially caused by the specific flow behavior of the sample liquid inside the microfluidic device. As an example of such a microfluidic device comprising the desired microfluidic structures, microfluidic chips are already known in the field, which provide microscale channels to receive microliter or nanoliter-scale samples in the form of streamable liquid. Microliter-scale reagents, typically filled in advance into an array of small wells provided as reaction chambers on the microfluidic chip, are placed therein for contacting a stream of sample liquid in a reaction flow channel, wherein each type of assay is dependent on the reagents loaded into the array of wells as well as the configuration of reaction channels and detectors. Such technology allows a plurality of assays to be carried out simultaneously on a miniaturized scale. Here, however, it is necessary to accurately control the amount or concentration of a certain substance or compound in a sample to be provided into each well. Most of these chemical, biochemical and/or biological assays are directed to the immobilization of biological materials such as polypeptides and nucleic acids, cells or tissues within the wells and the performance of one or more reactions with the immobilized material, followed by a quantitative and/or qualitative analytical process, such as luminescence test measurements, as is the case in the course of performing a polymerase chain reaction (PCR). One particular example of such assaying—being in the focus of the present disclosure—is the digital polymerase chain reaction method, also referred to as digital PCR or dPCR, which denotes a biotechnology refinement of conventional PCR methods that can be used to directly quantify and clonally amplify nucleic acids including DNA, cDNA or RNA. Here, the substantial difference between dPCR and traditional PCR lies in the method of measuring nucleic acids amounts, since traditional PCR carries out one reaction per single sample whereas dPCR carries out a single reaction within a sample which is separated into a large number of partitions and wherein the reaction is carried out in each partition individually such that a more reliable collection and sensitive measurement of nucleic acid amounts becomes possible.

In order to provide an efficient movement of sample liquid within such a microfluidic device and a sufficient filling of sample liquid in preferably all present wells, U.S. Pat. No. 8,859,204 B2 describes methods to analyze concentrations of specific nucleic acids in sample fluids and methods for detecting amplification of a target nucleic acid sequence, wherein miniaturized analytical assemblies in the form of porous sample retainers are filled with the sample fluids. In order to provide an improved filling property, according to an embodiment of U.S. Pat. No. 8,859,204 B2, the sample retainers exhibit a complex construction with a hydrophilic bottom and hydrophobic sidewalls. Such a complex structure of sample retainers, however, is difficult to manufacture, involving considerable manufacturing effort and costs.

As an alternative, U.S. Pat. No. 6,776,965 B2 describes a microfluidic device for analytical purposes, comprising, for example, a filling section for taking up a sample fluid, an analysis section connected to the filling section for analysis of the sample fluid, a waste section for collecting a dead volume of the sample fluid coming from the analysis section, and the like, which are all connected by a flow channel. Also, the microfluidic device of U.S. Pat. No. 6,776,965 B2 is provided with geometrical features for enhancing fluid transfer performance through the device's structure, such as butterfly and cascade structures, which geometrical features are supposed to provide a more homogeneous spread of the liquid stream of the sample fluid through the device. As a specific example of such a three-dimensional geometrical structure for enhancing fluid transfer performance, so-called pre-shooter stops are shown and described in one specific embodiment of the microfluidic device of U.S. Pat. No. 6,776,965 B2, which geometrical pre-shooter stops are provided in the form of irregularly shaped edges of the flow channel, such as triangular or saw-toothed edges of the flow channel, and are intended to slow down or hinder so-called pre-shooters.

The phenomenon of the occurrence of pre-shooters is exemplarily depicted in FIGS. 6A and 6B for better understanding. FIGS. 6A and 6B show the bottom layer 8 of a microfluidic device, comprising a flow channel 81 in which microstructures on the form of microwells 82 and an outlet opening 83 are provided. In the flow channel 81, an aqueous solution 9, such as a sample liquid, is streamed towards the outlet opening 83, which solution 9 is supposed to be filled into the microwells 82. Here, portions of the solution 9 on the inner walls of the flow channel 81 on either lateral side of the microwells 82 stream faster than, for example, in the lateral middle of the flow channel 81 due to the unstructured surface of the flow channel 81 in these areas, i.e. due to the lack of microwells 82 in these areas. These faster streaming portions are referred to as pre-shooters 91, wherein each pre-shooter 91 usually consists of a portion of the introduced aqueous solution 9, and which portion rushes ahead of the major bulk of introduced solution 9, as in the presently depicted case in the form of liquid column tips on a lateral side of the flow channel 81 between the microwells 82 and an inner wall of the flow channel 81. In case such pre-shooters 91 are not stopped at some point during the filling process, the solution 9 can pass through these unstructured areas past the microwells 82 and out of the outlet opening 83 of the microfluidic device, and would therefore be lost. Such an undesired occurrence can result in the already known microfluidic devices in approximately 50% loss of solution.

In U.S. Pat. No. 6,776,965 B2, the pre-shooter stops are intended to provide for an even advancing flow line of the sample fluid through the flow channel by inhibiting undesired edge fluid flow, i.e. so called pre-shooters, which effect should be achieved in that the capillary forces along the flow channel inner surface are disturbed by the thus provided discontinued inner surface of the flow channel. However, the provision of irregularly shaped edges for providing a geometrical disturbance of the inner surface of the flow channel in such a microfluidic device requires substantial structural customization of the design of already known microfluidic devices, involving additional or more cumbersome manufacturing steps and/or higher manufacturing precision, which again results in considerably higher manufacturing effort and, thus, manufacturing costs. Accordingly, in order to be able to achieve sufficient filling of sample liquid in preferably all present wells of a microfluidic device, a need exists for enhancing fluid transfer performance inside a flow channel of a microfluidic device in a simple and cost-efficient way.

SUMMARY

The present disclosure provides a microfluidic device comprising at least one flow channel connecting an inlet opening with an outlet opening; and an array of wells in fluid communication with said flow channel, wherein said flow channel comprises an inlet portion at said inlet opening, an outlet portion at said outlet opening, and a middle portion between said inlet portion and said outlet portion, wherein at least said middle portion comprises said array of wells and comprises a hydrophilic surface, and said flow channel further comprises a transition area provided at least between said middle portion and said outlet portion, which transition area comprises a hydrophobic surface.

Also provided is a method for manufacturing a microfluidic device as described herein, the method comprising at least the following steps:

molding of a bottom layer providing said flow channel with said inlet and outlet openings and said array of wells, thereby constituting a structured surface of said bottom layer, and providing a top layer in the form of a flat component, or molding of a top layer providing said flow channel with said inlet and outlet openings and of a bottom layer providing said array of wells, thereby constituting a structured surface of said bottom layer;

arranging a mask on said structured surface of said bottom layer;

providing a hydrophilic coating on said structured surface of said bottom layer not covered by said mask;

removing said mask from said bottom layer; and mounting said top layer onto said bottom layer, wherein any surface area of said bottom layer covered by said mask lacks said hydrophilic coating.

DESCRIPTION OF THE FIGURES

Further aspects and advantages of the present disclosure will become apparent from the following description of particular embodiments illustrated in the Figures in which:

FIG. 2A is a schematic view of a bottom layer of the microfluidic device of FIG. 1 covered by a mask for coating;

FIG. 2B is a schematic view of a bottom layer of the microfluidic device of FIG. 2A after coating and after removal of the mask;

FIG. 5A is a schematic view of a bottom layer of the microfluidic device of FIG. 1 covered by a further alternative mask for coating;

FIG. 5B is a schematic view of a bottom layer of the microfluidic device of FIG. 5A after coating and after removal of the further alternative mask;

DETAILED DESCRIPTION

Figure 1:
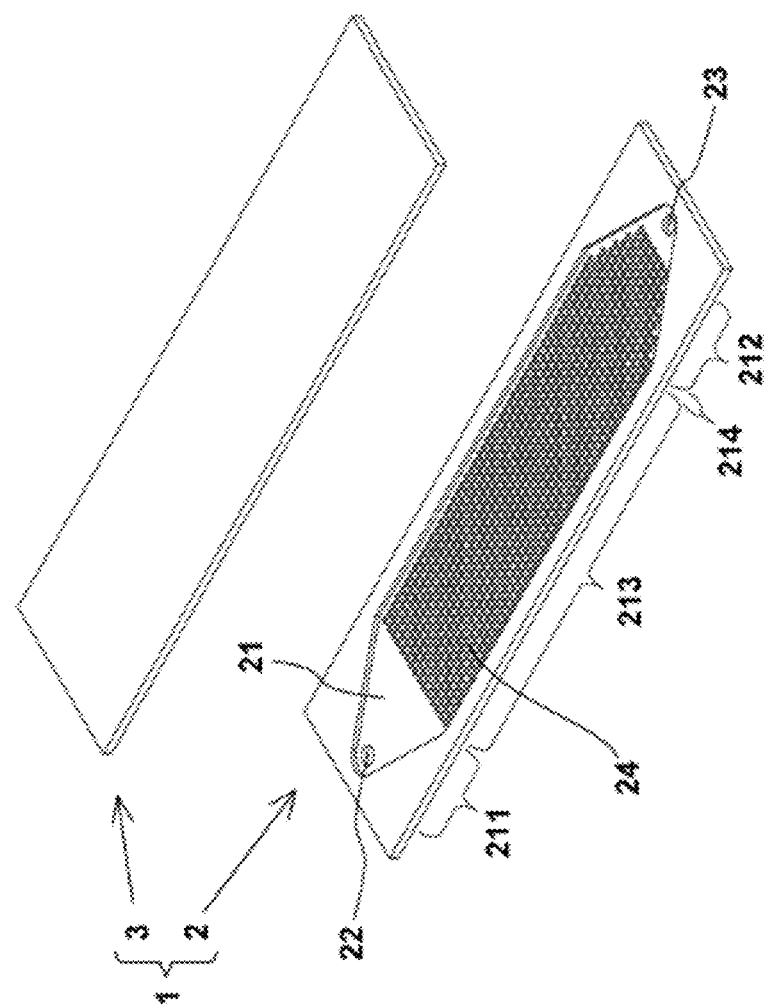
FIG. 1 is a schematic exploded view of a microfluidic device according to a first preferred embodiment of the present disclosure.

In view of the above, and in accordance with an aspect of the present disclosure, an improved microfluidic device is provided, preferably in the form of a consumable/disposable, which comprises at least one flow channel connecting an inlet opening with an outlet opening, and an array of wells, also referred to as partitions, in fluid communication with the flow channel, wherein the flow channel of the improved microfluidic device has an inlet portion at the inlet opening, an outlet portion at the outlet opening, as well as a middle portion between the inlet portion and the outlet portion. Here, the inlet opening is used for the introduction of fluid into the flow channel of the microfluidic device, and the outlet opening is used for the exit of fluid from the flow channel of the microfluidic device. Further, at least the middle portion of the microfluidic device comprises/exhibits the array of wells, which thus constitutes a so-called structured area with the wells as microstructures, and is provided with a hydrophilic surface. Preferably, the width of the entire flow channel, also referred to as lane width, resides in a range between 6 mm and 7 mm, further preferably 6.4 mm, which usually provides space in width for about 60 to 100 wells next to each other, i.e. in a lateral direction of the flow channel. Further, the flow channel also comprises a transition area or transitional area provided at least between the middle portion and the outlet portion, which transition area is constituted by providing a hydrophobic surface. This means that the transition area constitutes an area of transition from the mentioned hydrophilic surface to the characteristic hydrophobic surface.

The microfluidic device is preferably used for assaying a sample streamed in the form of a liquid to each of the wells by means of the flow channel, such as in the course of (d)PCR or biochemical assaying of a sample provided in the form of a sample liquid streamed to each of the wells. Here, the expression "streaming" is to be understood as either active streaming of a fluid, for example by pushing or pressure-squeezing the fluid, or passive streaming of a fluid, for example by drawing or sucking the fluid, such as by means of capillary forces. Since it is preferred that the microfluidic device of the present disclosure provides a very simple structure, a patterned surface with hydrophobic zones specifically around each single well is undesired, due to high manufacturing effort. However, a combination of an unstructured area between the wells and the flow channel wall, i.e. an area without anything like wells/partitions or the like, together with a hydrophilic surface can disadvantageously result in the occurrence of pre-shooters during a filling procedure of sample liquid into the wells since the flow resistance in such an unstructured area is lower than in the structured area. In order to avoid significant sample liquid loss due to the occurrence of pre-shooters, the transition area which is arranged at least between the middle portion and the outlet portion and which is constituted by a hydrophobic surface is provided in the microfluidic device of the present disclosure, thereby hindering the pre-shooters to pass the transition area too fast, in order to hold up or at least delay the pre-shooters of the sample liquid, such that a uniform swamping of the wells inside the flow channel is achieved, for uniformly filling all wells in the flow channel of the microfluidic device of the present disclosure. Thus, the transition area of the present disclosure can constitute a pre-shooter stop, or plurality of pre-shooter stops when considering the transition area to be provided on either side of the wells within the flow channel walls, for any fluid streaming through the flow channel from the inlet opening to the outlet opening. Here, it is to be noted that such a pre-shooter stop can only be achieved in the direction of streaming of the pre-shooters, by means of an area of a transition from a hydrophilic surface to a hydrophobic surface. A transition from a hydrophobic surface to a hydrophilic surface, on the other hand, should lead to a respectively reversed effect, i.e. an acceleration of the streaming flow.

In other words, the improved microfluidic device of the present disclosure, which is preferably used as a dPCR consumable, for example in the form of a microfluidic chip, substantially consists of an unstructured inlet portion, a structured middle portion which constitutes the area of interest having its microstructures in the form of wells, such as microwells or the like, and an outlet portion which preferably constitutes a waste area of the microfluidic device. Here, in its basic form, only the area of interest within the consumable, i.e. the structured middle portion provides a hydrophilic surface, and the rest of the microfluidic device is less hydrophilic, wherein a transition area or transition region between the middle portion and the outlet portion is constituted by a hydrophobic area. During the preferably capillary force-driven filling process of the flow channel of the microfluidic device with the sample liquid in the form of an aqueous solution, the wells are filled by the sample liquid while pre-shooters of sample liquid can advance on each side of the structured area, i.e. on each side of the middle portion between the wells and the respective flow channel wall, until the thus separately advancing pre-shooters are stopped at the transition area provided by the transition of hydrophilic surface to hydrophobic surface, wherein the hydrophobic properties of the transition area act as flow stops or flow brakes for the pre-shooters. During the subsequent processes in which the liquid sample is further pushed along the flow channel, the remaining wells are filled up while the transition area restrains the sample liquid of the pre-shooters from flowing into the waste area of the microfluidic device and, subsequently, out of the outlet opening. With such an improved flow-stop instrument in the form of a simple and efficient surface feature of the microfluidic device, a loss of sample liquid can at least be reduced to less than 10%, or might even be avoided entirely.

In accordance with a preferred configuration of the inventive microfluidic device, the outlet portion can also comprise wells, i.e. a structured area, and can also be provided with a hydrophilic surface. Thereby, the structured area of the microfluidic device can be enlarged, i.e. by combination of the structured area of the middle portion together with the structured area of the outlet portion. Here, the transition area is still provided between the middle portion and the outlet portion of the microfluidic device. Furthermore, the inlet portion of the inventive microfluidic device can also be provided with the hydrophilic surface. Thereby, it can be ensured that only the transition area provides a hydrophobic surface, compared to the hydrophilic surfaces of the remaining portions of the microfluidic device, in order to secure the function of the pre-shooter stop, i.e. the effect of stopping advancing fluid by means of the transition between hydrophilic surface properties and hydrophobic surface properties inside the flow channel.

Further preferably, the hydrophobic surface of the transition area is provided by material properties, i.e. properties of the material used for constituting the transition area, compared to the surrounding material, such as the properties of the material of the middle portion or the outlet portion, wherein the microfluidic device, or at least its hydrophobic parts, can consist of a hydrophobic material such as Cyclic Olefin Copolymer COC or Cyclic Olefin Polymer COP, wherein the use of COP is preferable, for example due to cost considerations. Alternatively, the hydrophobic properties of the surface of the transition area can also be provided by a hydrophobic coating which has been applied onto the flow channel surface between the middle portion and the outlet portion, thereby constituting the hydrophobic transition area. Similarly, the hydrophilic surface of one or several of the remaining portions of the microfluidic device can also be provided by a hydrophilic coating which has been applied onto the flow channel surface in the respective portions intended to provide hydrophilic surface properties, thereby constituting one or several hydrophilic areas inside the flow channel, in contrast to the transition area with hydrophobic surface properties. Alternatively, but less desirable, the hydrophilic surface could also be provided by means of hydrophilic material properties. Here, the preferably used hydrophilic coating can be a coating with a contact angle of <30°, i.e. between 0° and 30°, or preferably a coating with a contact angle of <20°, i.e. between 0° and 20°, or even further preferably a coating with a contact angle of <10°, i.e. between 0° and 10°. In order to achieve such a contact angle, for example, the hydrophilic coating can consist of a $SiO_2$ coating which is preferably applied onto the respective portion of the microfluidic device to be coated, i.e. the transition area, by electron beam coating or sputtering.

In accordance with a further preferred configuration of the inventive microfluidic device, the transition area has a width of more than the size of one well opening, and preferably less than the size of three well openings, wherein the term "well opening" refers to the flow channel entrance hole of each well through which the well is supposed to be filled with the liquid sample, including an intermediate space between wells. Also, the cross-sectional area of an opening of each well can have a circular shape, an oval shape, or a polygonal shape, such as a hexagonal shape. With a polygonal shape of the well opening, and particularly with a hexagonal shape of the well opening, it becomes possible to arrange the well openings to each other with less distance in between, i.e. achieve an increased density of distribution of well openings inside the flow channel. Accordingly, the number of wells in the array of wells of the plate can be further maximized. Here, it is further preferable that a width w of the well opening, including an intermediate space between wells, is 60 µm≤w≤110 µm, even further preferably 62 µm (small well)≤w≤104 µm (big well), meaning that the hydrophobic transition area is minimum 60 µm and maximum 330 µm wide such that the flow of the pre-shooters can be stopped while the hydrophilic waste area allows to retain excess sample liquid to be kept within the microfluidic device, if any.

According to the preferred configuration of the microfluidic device as described above, the transition area is provided between the middle portion and the outlet portion. However, the transition area can also comprise an extension or projection extending into the middle portion, preferably in the form/shape of a bar or nose or the like. Here, such a hydrophobic nose extending into the area of interest, i.e. the structured portion of the microfluidic device comprising the array of wells, can prohibit a joining of the separately advancing pre-shooters which are pushed through the flow channel on each side of the middle portion between the wells and the flow channel's inner surface wall, which joining might occur in case the pre-shooters on both lateral sides of the middle portion are held up by the transition area acting as pre-shooter stops and, thus, accumulate on both sides until they contact and merge with each other.

As to the general structure of the microfluidic device of the present disclosure, the same is preferably structured with at least a top layer and a bottom layer, wherein the bottom layer provides the flow channel with the inlet and outlet openings and the array of wells in a surface of the bottom layer, and wherein the top layer is constituted by a flat component covering the bottom layer surface, such as a foil or the like. Thereby, it becomes possible that only the bottom layer needs to be shaped in a particular manner in order to provide its structural features in the form of the flow channel, the inlet opening, the outlet opening and the array of wells, whereas the top layer can be provided by a simple foil or the like without the need of structuring the same. Here, the "bottom" layer of the microfluidic device is the lower part of the microfluidic device during the use of the microfluidic device, whereas the "top" layer of the microfluidic device is the upper part of the microfluidic device during the use of the microfluidic device. Alternatively, the microfluidic device can be structured with at least a top layer and a bottom layer, wherein the top layer provides the flow channel with the inlet and outlet openings, and wherein the bottom layer provides the array of wells in a surface of the bottom layer. With the configuration of the inventive microfluidic device in the form of a two-layered device, manufacturing of the inventive microfluidic device becomes simple, in particular since the top layer can merely be a plain component according to one alternative, such as an unstructured sheet or transparent foil or the like, and all substantial features of the microfluidic device are provided in one and the same layer, i.e. the bottom layer. Since either only the bottom layer or the bottom layer as well as the top layer, depending on the respectively chosen alternative, is to be manufactured by an appropriate manufacturing process, such as injection molding, embossing, deep drawing, photolithography or the like, the additional processing of the same in order to incorporate all substantial features of the inventive microfluidic device is marginal.

According to a further aspect of the present disclosure, a method for manufacturing a microfluidic device as described above is provided, wherein the inventive method comprises at least the step of molding of a bottom layer providing the flow channel with the inlet and outlet openings and the array of wells, thereby constituting a structured surface of the bottom layer, and providing a top layer in the form of a flat component. Here, the flat component can be anything like a foil or the like. Thereby, it becomes possible that only the bottom layer needs to be shaped in a particular manner in order to provide its structural features in the form of the flow channel, the inlet opening, the outlet opening and the array of wells, whereas the top layer can be provided by a simple foil or the like without the need of structuring the same. Alternatively to the previously described molding step, the method can also comprise the step of molding of a top layer providing the flow channel with the inlet and outlet openings and of a bottom layer providing the array of wells, thereby constituting a structured surface of the bottom layer. Thus, with such an alternative molding step, both the bottom layer and the top layer are molded with a very specific structure, respectively. Here, due to the variability of the molding process dependent on the used molds, the bottom layer and the top layer can be provided with any desired kind of structured surface, i.e. with any desired combination of flow channel, inlet opening, outlet opening and/or array of wells, as desired, as long as the generally required flow structure of the microfluidic device can be achieved. Further, the molding step can be an injection molding process or an injection embossing process. Alternatively, the molding step might also be a deep drawing process, a photolithography process or the like, if applicable.

As further step, the inventive method comprises the step of arranging a mask on the structured surface of the bottom layer, followed by the step of providing a hydrophilic coating on the structured surface of the bottom layer not covered by the mask. Here, the mask is to be understood as a plate-like component with holes that allow the coating to pass through in a defined pattern. Accordingly, any surface area of the bottom layer covered by the mask lacks the hydrophilic coating. Also, the coating step as carried out in the course of the manufacturing method of the present disclosure can be provided by means of electron beam coating or sputtering.

Subsequently, after a step of removing the mask from the bottom layer, and, thus, unveiling the non-coated areas of the bottom layer, i.e. the areas without hydrophilic surface properties, a step of mounting the top layer onto the bottom layer follows, which mounting step is preferably carried out by bonding. Thereby, the microfluidic device is substantially finalized, wherein the previously mentioned method steps are preferably carried out in the cited order. With the inventive method of microfluidic device manufacturing, in particular with the coating step, it becomes possible to provide a transition line or transition area between a hydrophilic coating of a certain part of the bottom layer and the remaining parts of the bottom layer that lack such a hydrophilic coating. Here, according to a preferred further development of the inventive method, any surface area lacking the hydrophilic coating provides a hydrophobic surface, either by means of material properties or by means of a hydrophobic coating, as has been described above in regard to the structural features of the microfluidic device. Thereby, a transition between the hydrophilic coating and the adjacent non-hydrophilic area is intensified or reinforced. Thus, an improved braking effect of the pre-shooter stops achieved by the transition area can be intensified. Further preferably, a surface area lacking the hydrophilic coating and being provided at least between the middle portion and the outlet portion constitutes the transition area for the provision of a pre-shooter stop, in order to be able to restrain any sample liquid from flowing into the waste area of the microfluidic device. With such an inventive flow-stop feature of the microfluidic device, a loss of sample liquid can at least be reduced to less than 10%, or, at best, a loss of sample liquid can completely be avoided.

In summary, the present disclosure is directed to the particular inventive idea of the provision of at least one pre-shooter stop by means of a transition area between a hydrophilic area and a hydrophobic area, which allows to counteract or at least hinder the advance of pre-shooters between wells and the lateral flow channel walls, such that a waste of prematurely occurring outflowing sample liquid can be avoided.

The present disclosure is not limited to the particular methodology and reagents described herein because they may vary. Although any methods and materials similar or equivalent to those described herein can be used in the practice of the present disclosure, the preferred methods and preferred materials are described herein. Further, the terminology used herein is for the purpose of describing particular embodiments only and is not intended to limit the scope of the present disclosure.

As used herein and in the appended claims, the singular forms "a", "an", and "the" include plural reference unless the context clearly dictates otherwise. Similarly, the words "comprise", "contain" and "encompass" are to be interpreted inclusively rather than exclusively. Similarly, the word "or" is intended to include "and" unless the context clearly indicates otherwise. The terms "plurality", "multiple" or "multitude" refer to two or more, i.e. 2 or >2, with integer multiples. Furthermore, the term "at least one" is to be understood as one or more, i.e. 1 or >1, also with integer multiples.

The dPCR consumable microfluidic device which is preferably achieved by the present disclosure comprises, in a preferred embodiment, a main part made of injection molded Cyclic Olefin Polymer (COP) comprising a microchannel structure which is covered by a COP foil to generate a closed microchannel device. Here, the microchannel basically consists of an unstructured inlet part, a structured middle part (the area of interest, wherein the structures are the microwells) and a structured outlet part, i.e. the waste area. Since only the inlet part and the area of interest within the consumable are coated with a hydrophilic coating and the rest of the consumable is uncoated, i.e. less hydrophilic, pre-shooter stops can be achieved in a simple manner. Here, according to a preferred embodiment, the hydrophilic coating consists of $SiO_2$-layer with approximately 40 nm thickness deposited by electron beam coating, also referred to as ebeam coating. The advantageous selective coating is achieved by using masks that selectively shield the desired areas of the consumable from the coating molecules. Thus, it can be achieved that—during the filling process of the inventive microfluidic device with a sample liquid in the form of an aqueous solution—the wells are filled but the pre-shooters only flow on the side of the structured area until they are stopped at the transition of coated to uncoated surface where the uncoated structures act as flow stop or pre-shooter stop. During the subsequent separation process where a separation fluid pushes the sample liquid along the flow channel, the remaining microwells are filled and the pre-shooter stop still prevent the aqueous solution from flowing into the waste area. With this pre-shooter stop feature of the inventive microfluidic device, the loss of aqueous solution can be reduced from approximately 50% as caused in the known microfluidic devices to less than 10%.

The following examples are intended to illustrate various preferred embodiments of the disclosure. As such, the specific modifications as discussed hereinafter are not to be construed as limitations on the scope of the present disclosure. It will be apparent to the person skilled in the art that various equivalents, changes, and modifications may be made without departing from the scope of the present disclosure, and it is thus to be understood that such equivalent embodiments are to be included herein.

EXAMPLES

In FIG. 1, a microfluidic device 1 is illustrated in an exploded view, wherein a bottom component or bottom layer 2 and a top component or top layer 3 in the form of a flat foil are shown separated from each other. The bottom layer 2 is provided with a recess in its upper surface, which recess constitutes a flow channel 21. Here, the flow channel 21 exhibits an oblong shape with narrowings on both longitudinal sides, such that the flow channel 21 connects an inlet opening 22 in the form of a through-hole through the bottom layer 2 with an outlet opening 23, also in the form of a through-hole through the bottom layer 2. In general, the flow channel 21 is zoned or divided into different portions, starting with an inlet portion 211 comprising the inlet opening 22, proceeding to a middle portion 213 comprising microwells 24 in the form of indentations in the surface of the flow channel 21, i.e. with a closed bottom, and ending in an outlet portion 212 comprising the outlet opening 23 as well as further microwells 24. Since, in this embodiment, the microwells 24 are provided in the middle portion 213 as well as the outlet portion 212, both the middle portion 213 and the outlet portion 212 constitute a structured or microstructured area, with the microwells 24 being the structure or microstructure. Here, between the middle portion 213 and the outlet portion 212, a transition area 214 is defined, which transition area 214 constitutes an area of transition or crossing-over between a surface exhibiting hydrophilic surface properties and a surface exhibiting hydrophobic surface properties, which will be further explained in the following with reference to the further figures.

Accordingly, in FIGS. 2A and 2B, a coating process for coating of the bottom layer 2 is shown, wherein FIG. 2A shows the bottom layer 2 with a mask 4 provided on top, wherein the mask 4 comprises a perforation or through-hole 41 which basically traces the shape of the flow channel 21 of the bottom layer 2 except for the outlet portion 212. Here, the outlet portion 212 is covered by a closed part 42 of the mask 4, such that only the inlet portion 211 and the middle portion 213 are exposed. Now, when coating the bottom layer 2 preferably by means of electron beam coating with a hydrophilic coating 5 such as $SiO_2$ coating, only the exposed portions 211, 213 are coated with the hydrophilic coating 5, as can be gathered from FIG. 2B in which the bottom layer 2 is illustrated after coating has been performed and the mask 4 has been removed. In FIG. 2B, it can be gathered that the inlet portion 211 and the middle portion 214 are covered by the hydrophilic coating 5, and that the outlet portion 212 is not coated, i.e. coincides with an uncoated area 6. Here, the transition area 214 is, thus, established at the transition line between coating 5 and uncoated area 6, i.e. between the coated middle portion 213 and the uncoated outlet portion 212. In FIG. 2B, the transition area 214 between coating 5 and uncoated area 6 is also depicted in an enlarged detail view, in which the transition line is marked with a broken line for clarification.

Figure 3B:
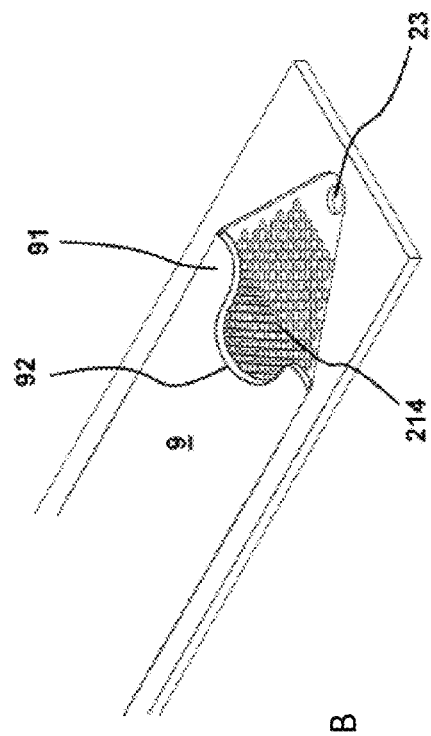
FIGS. 3A-3B schematically illustrate a progress of liquid inside the flow channel of the bottom layer of the microfluidic device of the first preferred embodiment of the present disclosure in two subsequent stages with the pre-shooter stops on both inner walls of the flow channel delaying the advance of the pre-shooters.
Figure 3A:
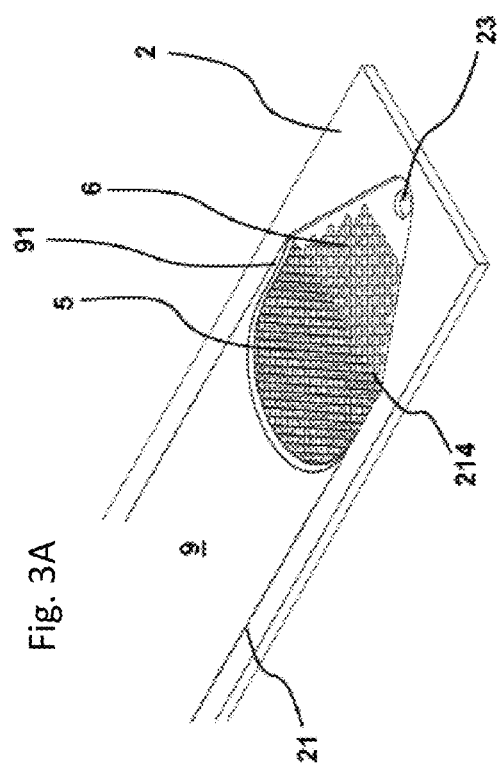
Figure 6B:
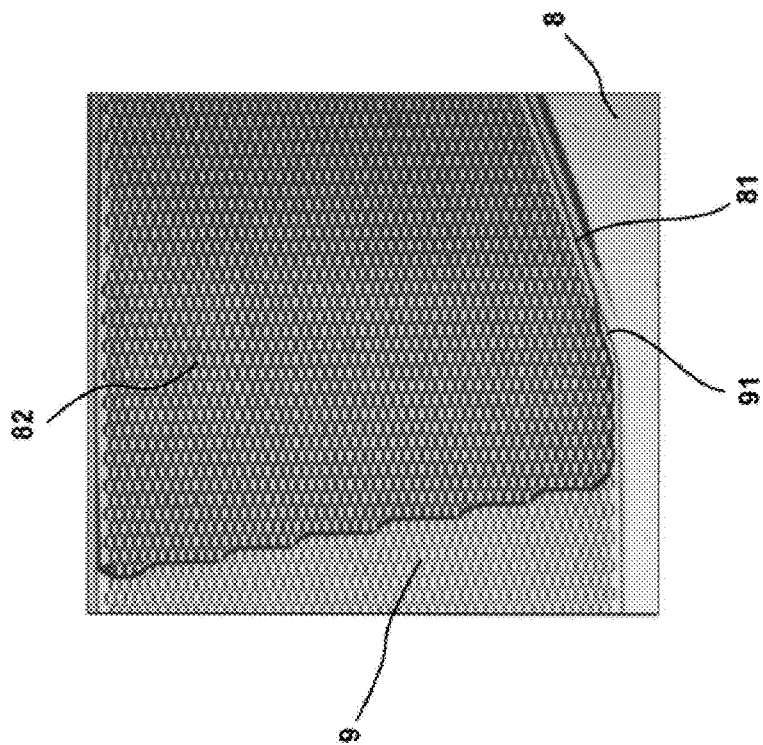
FIG. 6B is a photographic image of the occurrence of pre-shooters during an experimental progress of liquid inside a flow channel of a bottom layer of a microfluidic device.
Figure 6A:
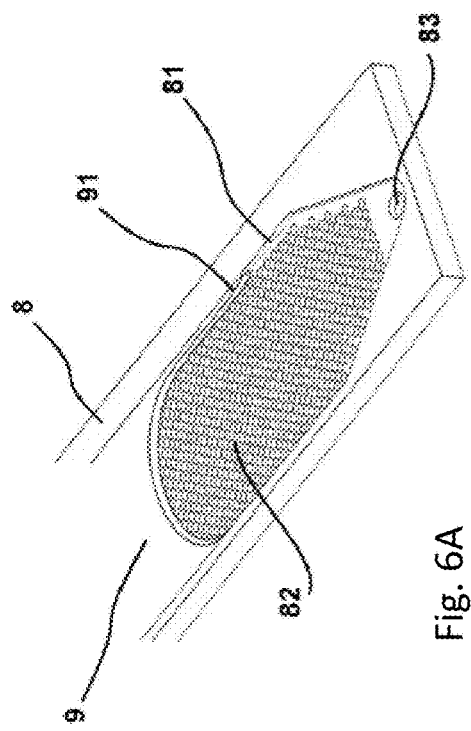
FIG. 6A schematically illustrates the occurrence of pre-shooters during a progress of liquid inside a flow channel of a bottom layer of a microfluidic device.

With a microfluidic device 1 comprising a selectively coated bottom layer 2 as shown and described with reference to FIG. 2B, the transition area 214 is provided as a pre-shooter stop. Now, when streaming a fluid 9 as known from FIGS. 6A and 6B through the selectively coated flow channel 21, as is depicted in FIGS. 3A and 3B, the fluid 9, usually in the form of a sample liquid, advances through the flow channel 21 with pre-shooters 91 advancing faster on the lateral side edges of the flow channel 21. Here, however, the pre-shooters 91 are delayed or hindered at a flow stop in form of the transition area 214, such that the remaining part of the fluid 9, i.e. the major bulk of the fluid 9, catches up, meaning that the pre-shooters 91 are widening and a concave front 92 of the fluid 9 is proceeding so that, at some point, the front of the fluid 9 proceeds preferably uniformly towards the outlet opening 23. It is to be noted that the fluid 9 can be only a sample liquid, or can also be a part sample liquid and a part separation fluid which pushes the sample liquid ahead.

Figure 4B:
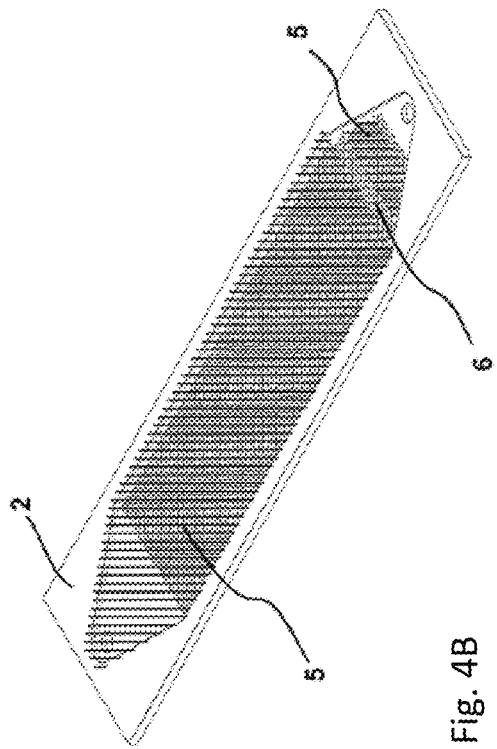
FIG. 4B is a schematic view of a bottom layer of the microfluidic device of FIG. 4A after coating and after removal of the alternative mask.
Figure 4A:
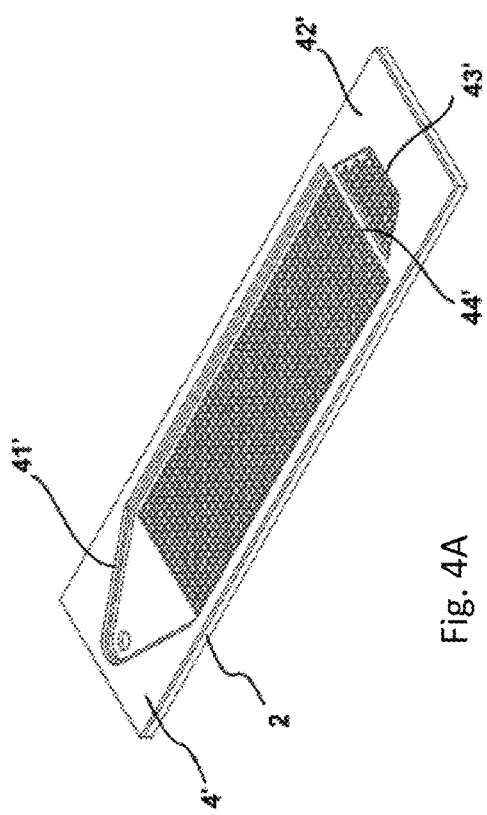
FIG. 4A is a schematic view of a bottom layer of the microfluidic device of FIG. 1 covered by an alternative mask for coating.

In FIG. 4A, a similar formation as in FIG. 2A is shown. Here, however, an alternative mask 4' is used. Accordingly, a coating process for coating of the bottom layer 2 is shown, wherein FIG. 4A shows the bottom layer 2 with the mask 4' provided on top, wherein the mask 4' comprises a perforation or through-hole 41' which basically traces the shape of the flow channel 21 of the bottom layer 2 except for the outlet portion 212. Here, the outlet portion 212 is basically covered by a substantially closed part 42' of the mask 4', wherein a smaller perforation or through-hole 43' is provided in the substantially closed part 42', leaving a bridge 44' between the perforation 41' and the smaller perforation 43', such that not only the inlet portion 211 and the middle portion 213 are exposed, but that also a part of the outlet portion 212 is exposed. Now, when coating the bottom layer 2 preferably by means of electron beam coating with a hydrophilic coating 5 such as $SiO_2$ coating, not only the exposed portions 211, 213 are coated with the hydrophilic coating 5, but also an exposed part of the outlet portion 212 is coated with the hydrophilic coating 5, which exposed part was arranged underneath the smaller perforation 43', as can be gathered from FIG. 4B in which the bottom layer 2 is illustrated after coating has been performed and the mask 4' has been removed. In FIG. 4B, it can be gathered that the inlet portion 211 and the middle portion 214 as well as the exposed part of the outlet portion 212 are covered by the hydrophilic coating 5, and that the non-exposed or covered part of the outlet portion 212 is not coated, i.e. coincides with an uncoated area 6. Here, the transition area 214 is, thus, established at the transition line between coating 5 and uncoated area 6, i.e. between the coated middle portion 213 and the uncoated part of the outlet portion 212.

In FIG. 5A, a similar formation as in FIG. 2A is shown. Here, however, a further alternative mask 4" is used. Accordingly, in FIGS. 5A and 5B, a coating process for coating of the bottom layer 2 is shown, wherein FIG. 5A shows the bottom layer 2 with the mask 4" provided on top, wherein the mask 4" comprises a perforation or through-hole 41" which basically traces the shape of the flow channel 21 of the bottom layer 2 except for the outlet portion 212. Here, the outlet portion 212 is covered by a closed part 42" of the mask 4", such that only the inlet portion 211 and the middle portion 213 are exposed. Also, a boom or finger 421" is provided in the mask 4" which extends from the closed part 42" of the mask 4" into the perforation 41". Now, when coating the bottom layer 2 preferably by means of electron beam coating with a hydrophilic coating 5 such as $SiO_2$ coating, only the exposed portions 211, 213, with the exception of the area that is covered by the finger 421", are coated with the hydrophilic coating 5, as can be gathered from FIG. 5B in which the bottom layer 2 is illustrated after coating has been performed and the mask 4" has been removed. In FIG. 5B, it can be gathered that the inlet portion 211 and most of the middle portion 213 are covered by the hydrophilic coating 5, and that the outlet portion 212 as well as the part of the middle portion 214 which was covered by the finger 421" is not coated, i.e. coincides with an uncoated area 6 as well as an uncoated nose 61 that protrudes into the coated part of the middle portion 213. Here, the transition area 214 is, thus, established at the transition line between coating 5 and uncoated area 6 and uncoated nose 61, i.e. between the coated part of the middle portion 213, the uncoated part of the middle portion 213 and the uncoated outlet portion 212. Here, such a hydrophobic nose 61 extending into the hydrophilic part of the middle portion 213 can prohibit a joining of the separately advancing pre-shooters 91 which are pushed through the flow channel 21 on each side of the middle portion 213 between the microwells 24 and the flow channel's inner surface wall, which joining might occur in case the pre-shooters 91 occur on both lateral sides of the middle portion and are held up by the transition area 214 acting as pre-shooter stops and, thus, accumulate on both sides until they contact and merge with each other.

The present application is not to be limited in scope by the specific embodiments described herein. Indeed, various modifications in addition to those described herein will become apparent to those skilled in the art from the foregoing description and accompanying figures. Such modifications are intended to fall within the scope of the claims. Various publications are cited herein, the disclosures of which are incorporated by reference in their entireties.

The invention claimed is:

1. A microfluidic device comprising:
   at least one flow channel connecting an inlet opening with an outlet opening; and
   an array of wells in fluid communication with said flow channel;
   wherein said flow channel comprises:
   an inlet portion comprising a hydrophilic surface at said inlet opening,
   an outlet portion at said outlet opening, and
   a middle portion between said inlet portion and said outlet portion;
   wherein said middle portion comprises a first portion of said array of wells and comprises a hydrophilic surface;

wherein the outlet portion comprises:
- a second portion of said array of wells,
- a transition area provided between said middle portion and said outlet opening that includes at least a portion of said second portion of said array of wells, which transition area comprises a hydrophobic surface,
- a hydrophilic outlet area provided between said transition area and said outlet opening that comprises a hydrophilic surface.

2. The microfluidic device of claim 1, wherein said transition area comprises a pre-shooter stop for a fluid flowing through said flow channel from said inlet opening to said outlet opening.

3. The microfluidic device of claim 1, wherein said transition area has an extension extending into said middle portion, wherein the extension comprises a bar or a nose.

4. The microfluidic device of claim 1, wherein said hydrophobic surface is provided by a hydrophobic coating.

5. The microfluidic device of claim 1, wherein said hydrophilic surface is provided by a hydrophilic coating.

6. The microfluidic device of claim 5, wherein said hydrophilic coating has a contact angle of between <10 and <30°.

7. The microfluidic device of claim 5, wherein said hydrophilic coating comprises a $SiO_2$ coating.

8. The microfluidic device of claim 5, wherein said hydrophilic coating is applied by electron beam coating or sputtering.

9. The microfluidic device of claim 1, wherein the microfluidic device comprises a hydrophobic material selected from one or more of Cyclic Olefin Copolymer (COC) and Cyclic Olephin Polymer (COP).

10. The microfluidic device of claim 1, wherein said transition area has a width between the size of one to three well openings.

11. The microfluidic device of claim 10, wherein the transition area has a width between 60 μm and 330 μm.

12. The microfluidic device of claim 1, wherein the microfluidic device comprises at least a top layer and a bottom layer, said bottom layer provides said flow channel with said inlet and outlet openings, and said array of wells in a surface of said bottom layer, and said top layer comprises a flat component covering said surface of said bottom layer.

13. The microfluidic device of claim 1, wherein the microfluidic device comprises at least a top layer and a bottom layer, said top layer providing said flow channel with said inlet and outlet openings and said bottom layer providing said array of wells in a surface of said bottom layer.

14. The microfluidic device of claim 1, wherein the transition area comprises a plurality of pre-shooter stops and at least one or more pre-shooter stops of the plurality of pre-shooter stops are positioned on a lateral side of said middle portion.

15. The microfluidic device of claim 14 wherein at least two or more pre-shooter stops of the plurality of pre-shooter stops are positioned on both lateral sides of said middle portion.

16. The microfluidic device of claim 1, wherein a width of a well opening of the array of wells is 60 μm≤w≤110 μm.

17. The microfluidic device of claim 1, wherein the transition area further comprises a projection extending into the middle portion.

18. The microfluidic device of claim 16, wherein the projection includes a bar shape extending into the middle portion.

19. The microfluidic device of claim 1, wherein the outlet portion comprises a tapered portion that is tapered relative to the middle portion, and wherein the transition area is provided in the tapered portion.

* * * * *